US006229326B1

United States Patent
Yu

(10) Patent No.: US 6,229,326 B1
(45) Date of Patent: May 8, 2001

(54) METHOD AND APPARATUS FOR TESTING ELECTRONIC DEVICE IN BURN-IN PROCESS

(75) Inventor: Joe Yu, Taoyuan Hsien (TW)

(73) Assignee: Delta Electronics, Inc., Taoyuan Hsien (TW)

(*) Notice: Subject to any disclaimer, the term of this patent is extended or adjusted under 35 U.S.C. 154(b) by 0 days.

(21) Appl. No.: 09/412,152

(22) Filed: Oct. 5, 1999

(30) Foreign Application Priority Data

May 3, 1999 (TW) ................................................ 88107171

(51) Int. Cl.[7] ..................................................... G01R 31/02

(52) U.S. Cl. .......................... 324/760; 324/765; 324/763; 714/718

(58) Field of Search ....................................... 324/765, 763, 324/760, 158.1, 435, 436, 761; 714/718, 719, 720, 721; 340/514

(56) References Cited

U.S. PATENT DOCUMENTS

| 4,296,375 | * | 10/1981 | Takezaki | 324/158.1 |
| 4,707,654 | * | 11/1987 | Suzuki et al. | 324/158.1 |
| 5,570,035 | * | 10/1996 | Dukes et al. | 324/763 |

* cited by examiner

Primary Examiner—Safet Metjahic
Assistant Examiner—Jimmy Nguyen

(57) ABSTRACT

A method and an apparatus are provided for determining a defect of an electronic device in a burn-in process. The method for testing the electronic device having a plurality of output signals includes steps of (a) providing a test circuit electrically connected to the electronic device, (b) detecting one of a normal and a abnormal state of the electronic device by checking the output signals, and (c) generating a first signal when the electronic device is in the normal state and generating a second signal when the electronic device is in the abnormal state. The method further includes steps of (d) rechecking the plurality of output signals and (e) generating a third signal when the electronic device is in the abnormal state at previously testing period and in the normal state at subsequently testing period.

23 Claims, 2 Drawing Sheets

METHOD AND APPARATUS FOR TESTING ELECTRONIC DEVICE IN BURN-IN PROCESS

FIELD OF THE INVENTION

The present invention relates to a method and an apparatus for testing an electronic device in a burn-in process.

BACKGROUND OF THE INVENTION

Usually, the final step of manufacturing an electronic device is a testing process. The testing process is used for detecting a defect of the product. One of these testing processes is a burn-in process. In the burn-in process, a lot of electronic devices are operated under a temperature higher than the room temperature for a period of time. It is easier to detect a poor electronic device at a high temperature. The quality of the electronic device passing the burn-in test is better.

The output power signal of the electronic device is measured in the burn-in process. The state of the electronic device is detected by checking the output power signal. The electronic device is in a normal state when the output power signal has a voltage level greater than a predetermined minimal value and the electronic device is in an abnormal state when the output power signal has a voltage level lower than a predetermined minimal value. For example, if the standard power of an electronic device is 5V and the corresponding minimal value is 3.3V, the electronic device is in an abnormal state when the actual output power of the electronic device is smaller than 3.3V.

In the conventional burn-in process, an indicating lamp is connected with the electronic device. When the electronic device is in the normal state, an indicating signal will be generated and then the indicating lamp will be turned on. On the contrary, the lamp will be turned off when the electronic device is in the abnormal state.

The major disadvantage of the conventional burn-in process is that some failed electronic devices may not be found. The output power signal of the electronic device may not be stable when the electronic device is operated. The voltage level of the power signal might be smaller than its minimal value in the first time and larger than the minimal value in the second time. That is, the electronic device might be in the abnormal state during the first burn-in testing period and in the normal state at the next testing period. So, the electronic device having a transient defect will be determined as a good one. The quality of the electronic device will be reduced. Therefore, it is tried by the applicant to solve the above-described problem.

SUMMARY OF THE INVENTION

An object of the present invention is to provide a method and an apparatus for testing an electronic device in a burn-in process.

Another object of the present invention is to provide a method and an apparatus for testing a circuit in a burn-in process.

According to the present invention, the method for testing an electronic device having a plurality of output signals in a burn-in process includes steps of (a) providing a test circuit electrically connected to the electronic device, (b) detecting one of a normal and an abnormal state of the electronic device by checking the output signals, and (c) generating a first signal when the electronic device is in the normal state and generating a second signal when the electronic device is in the abnormal state. The method further includes steps of (d) rechecking the plurality of output signals and (e) generating a third signal when the electronic device is in the abnormal state at previously testing period and in the normal state at subsequently testing period.

Certainly, the plurality of output signals include a 12V output signal, a 5V output signal, a 3.3V output signal, and a power good signal.

Certainly, the electronic device is in the normal state when each of the output signals has a voltage level greater than a predetermined minimal value and the electronic device is in the abnormal state when one of the output signals has a voltage level lower than a predetermined minimal value.

Certainly, the predetermined minimal value is 8.5V when the voltage level of the output signal is 12V. The predetermined minimal value is 3.3V when the voltage level of the output signal is 5V. The predetermined minimal value is 2.2V when the voltage level of the output signal is 3V. The predetermined minimal value of the power good signal is 3V.

Certainly, the first signal is a green light signal, the second signal is a red light signal, and the third signal is an orange light signal by combining the green light signal and the red light signal.

Certainly, the step (c) further includes a step of maintaining the second signal when the electronic device is in the abnormal mode.

In accordance with another aspect of the present invention, a method for testing an electronic device having an output signal in a burn-in process includes steps of (a) providing a test circuit electrically connected to the electronic device, (b) detecting one of a normal and a abnormal state of the electronic device by checking the output signal, (c) generating a first signal when the electronic device is in the normal state and generating a second signal when the electronic device is in the abnormal state, (d) rechecking the output signal, and (e) generating a third signal when the electronic device is in the abnormal state at previously testing period and in the normal state at subsequently testing period.

Certainly, the electronic device is in the normal state when the output signal has a voltage level greater than a predetermined minimal value and the electronic device is in the abnormal state when the output signal has a voltage level lower than a predetermined minimal value.

In accordance with another aspect of the present invention, an apparatus for testing an electronic device having a plurality of output signals in a burn-in process includes a first test circuit and a second test circuit. The first test circuit is electrically connected to the electronic device for detecting one of a normal state and an abnormal state of the electronic device by checking the output signals and generating a first signal when the electronic device is in the normal state. The second test circuit is electrically connected to the first test circuit for checking the output signals and generating a second signal when the electronic device is in the abnormal state. A third signal is generated to indicate that the electronic device is in the abnormal state at a previously testing period and in the normal state at a subsequently testing period after the electronic device is re-tested by the first and second test circuit.

Certainly, the first test circuit includes a plurality of photo-coupled transistors, a first light-emitting diode (LED) for generating the first signal in response to the normal state of the electronic device, and a buffer gate electrically connected between the first LED and the photo-coupled transistors for allowing the first LED to generate the first signal.

Certainly, the buffer gate includes a plurality AND gates connected in parallel.

Certainly, the second test circuit includes a second LED for generating the second signal in response to the abnormal state of the electronic device, and a switch mounted between the first test circuit and the second LED for allowing the second LED to generate the second signal.

Certainly, the switch includes two AND gates and two silicon-controlled rectifiers (SCR).

The present invention may best be understood through the following description with reference to the accompanying drawings, in which:

DETAILED DESCRIPTION OF THE PREFERRED EMBODIMENTS

In the testing method of the present invention, the state of the electronic device is detected by checking the output signals. The electronic device is in a normal state when each of these output signals has a voltage level greater than a predetermined minimal value. On the other hand, the electronic device is in an abnormal state when one of these output signals has a voltage level lower than a predetermined minimal value.

A first signal is generated when the electronic device is in the normal state and a second signal is generated when the electronic device is in the abnormal state. The second signal will be maintained for a longer time. Thereafter, the output signals are rechecked again. The rechecking process is controlled by a burn-in (B/I) signal. A third signal will be generated when the electronic device is in the abnormal state at previously testing period and in the normal state at subsequently testing period. The output signal may be a 12V output signal, a 5V output signal, a 3.3V output signal, or a power good signal. The predetermined minimal values of these output signals are 8.5V, 3.3V, 2.2V, and 3V, respectively. The first signal is a green-light signal, the second signal is a red-light signal, and the third signal is an orange light signal by combining the green light signal and the red light signal.

Figure 1:
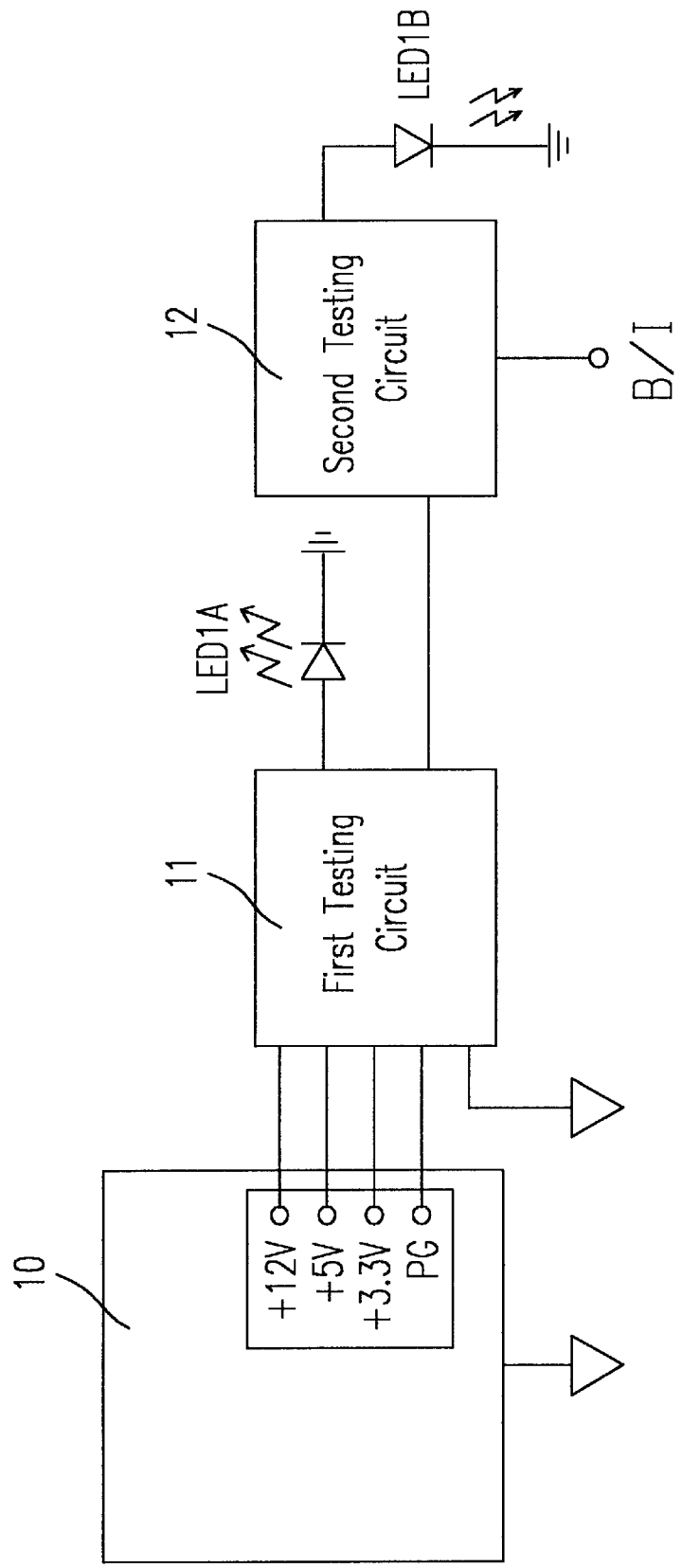
FIG. 1 is a block diagram showing the apparatus for testing an electronic device in a burn-in process of the present invention.

Please refer to FIG. 1 which shows the apparatus for testing the electronic device in the burn-in process. The electronic device 10 can be a circuit and has at least one output signal. The apparatus for testing the electronic device includes a first test circuit 11 and a second test circuit 12 for detecting the state of the electronic device.

The first test circuit 11 is electrically connected to the electronic device 10 for detecting the state of the electronic device by checking the output signals. The first test circuit 11 will generate a first signal when the electronic device is in the normal state. The second test circuit 12 is electrically connected to the first test circuit 11 for checking the output signals and generating a second signal when the electronic device is in the abnormal state. The electronic device 10 will be re-tested by these test circuits during the next testing period. A third signal is generated to indicate that the electronic device is in the abnormal state at a previously testing period and in the normal state at a subsequently testing period.

Figure 2:
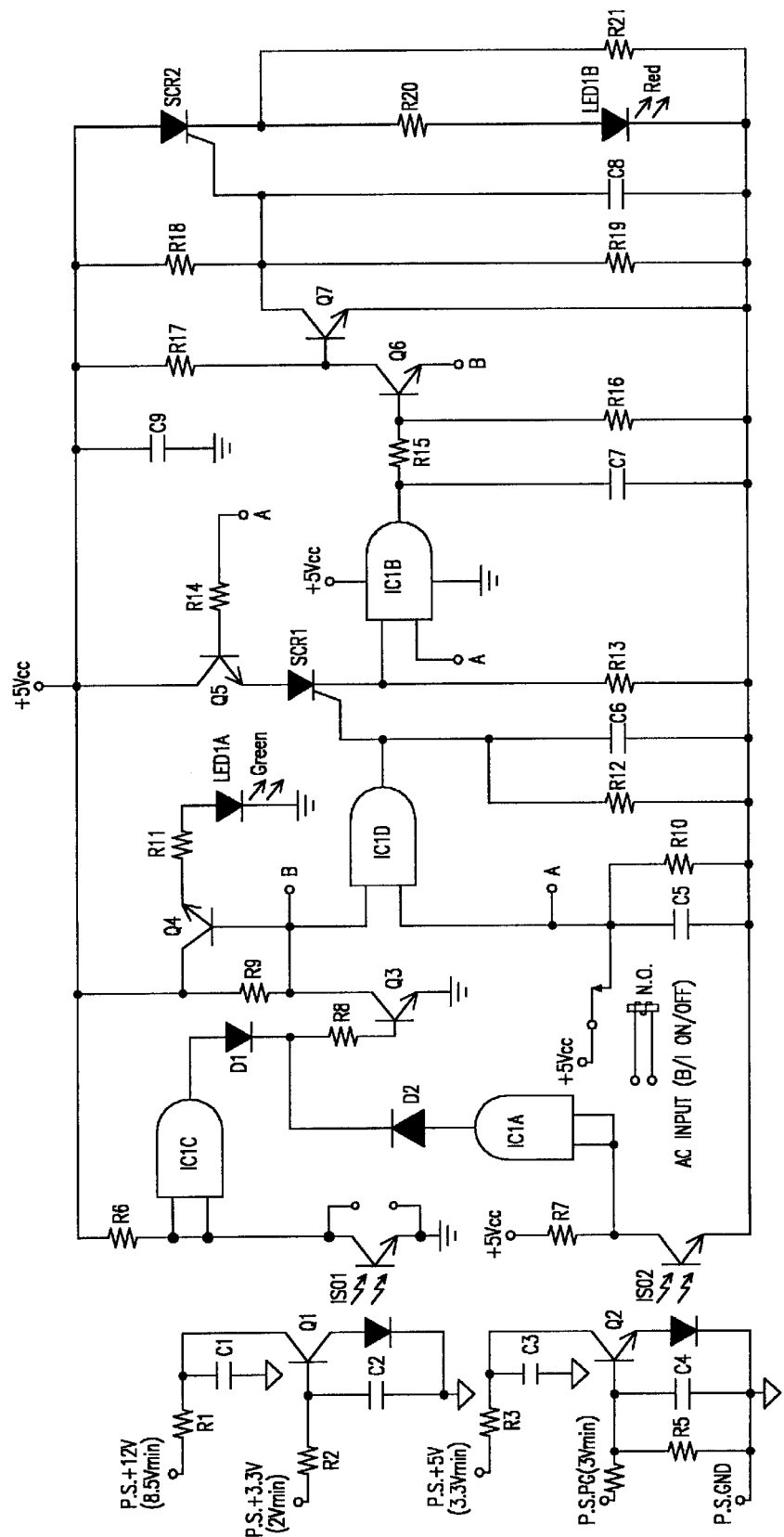
FIG. 2 schematically shows the circuit for testing the electronic device in the burn-in process of the present invention.

Please refer to FIG. 2 which shows the detailed circuit of the present invention. The power signals of the electronic device include a 12V signal, a 5V signal, a 3.3V signal, and a power good signal. The predetermined minimal values of these power signals are 8.5V, 3.3V, 2.2V, and 3V, respectively. The first test circuit 11 includes a plurality of photo-coupled transistors, a buffer gate, and a first light-emitting diode (LED) (LED1A) for generating the first signal. The buffer gate is electrically connected between the first LED and the photo-coupled transistors for allowing the first LED to generate the first signal. The buffer gate includes a plurality of AND gates and the input ends of the AND gates are connected in parallel.

The second test circuit 12 includes a second LED (LED1B) for generating the second signal and a switch mounted between the first test circuit 11 and the second LED (LED1B) for allowing the second LED to generate the second signal. The switch includes tow AND gates and two silicon-controlled rectifiers SCR1, SCR2. The first signal is a green-light signal and the second signal is a red-light signal.

The first test circuit 11 further includes several resistors, transistors, and diodes. These power sources of the electronic device are respectively connected with four resistors R1, R2, R3, and R4, and then connected with two transistors Q1, Q2. When all output signals are greater than the minimal values, the transistors Q1, Q2 are saturated and then two photo-coupled transistors ISO1, IS02 are turned on. The input voltages of the AND gates IC1A, IC1C are low and the transistor Q3 is turned off. The current passes from the resistor R9 to the node B, so the voltage of the node B is high and the transistor Q4 is turned on. Finally, the current passes from the resistor R11 to the first LED (LED1A). The green light is generated. At the same time, a high-voltage signal is transmitted from node B to the transistor Q6, so the transistor Q6 is turned off and the transistor Q7 is turned on. The silicon-controlled rectifier SCR2 is then turned off and the red light will not be generated by the second LED (LED1B).

On the other hand, the electronic device is in the abnormal state when one of these output signals has a voltage level lower than the predetermined minimal value. In the abnormal state, the AND gates IC1A, IC1C will transmit high-voltage signals to the transistor Q3 for turning off the transistor Q3. The voltage of the node B becomes low, the transistor Q4 is turned off, and then the green light will not be generated. At the same time, the voltage of the node A is high and transistor Q5 is turned on. The input end of the AND gate IC1D has a high voltage. The silicon-controlled rectifier SCR1 is turned on. A voltage-drop is generated when the current passes through the resistor R13. The input end of the AND gate IC1B has a high voltage, so the transistor Q6 is turned off and the transistor Q7 is turned on. Therefore, the silicon-controlled rectifier SCR2 is turned on and the current passes from the resistor R12 to the second LED (LED1B). The red light is then generated.

However, some electronic devices may have transient defects. Therefore, a red light may be generated at the first time and a green light may be generated at the second time. In order to detect this kind of defect, the electronic device will be tested in two testing periods. The rechecked process is controlled by a burn-in signal. Further, the red light generated by the silicon-controlled rectifier SCR2 will be maintained over these two testing periods. Because the first LED (LED1A) and the second LED (LED1B) are arranged in one package, an orange light will be generated when the red light and the green light are generated together in the subsequently testing period. The orange light is a third signal to indicate that the electronic device is in the abnormal state at the previously testing period and in the normal state at the subsequently testing period.

Certainly, the first, second, and third signals will not be limited to green, red, and orange light signals. The major improvement made by the present invention is that an electronic device having a transient defect can be found out by the above-described method and apparatus.

In conclusion, the state of the electronic device is checked repeatedly during the burn-in process. A green light is generated when the electronic device is in the normal state and a red light is generated when the electronic device is in the abnormal state. The red light will be maintained until the burn-in process is done. An orange light will be generated when the electronic device is in the abnormal state at the previously testing period and in the normal state at the subsequently testing period. That is to say, the orange light is used to indicate that the electronic device has a transient defect. Therefore, the indicating light is finally off when the electronic device is normal. On the contrary, the red light is on when the electronic device is abnormal or has a transient defect during the burn-in process. This way can ensure that the quality of the electronic device is good.

While the invention has been described in terms of what are presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A method for testing an electronic device in a burn-in process, wherein said electronic device has a plurality of output signals, comprising steps of:
    (a) providing a test circuit electrically connected to said electronic device;
    (b) detecting one of a normal state and an abnormal state of said electronic device by checking said plurality of output signals;
    (c) generating a first signal when said electronic device is in said normal state and generating a second signal when said electronic device is in said abnormal state;
    (d) rechecking said plurality of output signals; and
    (e) generating a third signal when said electronic device is in said abnormal state at previously testing period and in said normal state at subsequently testing period.

2. The method according to claim 1 wherein said plurality of output signals include a 12V output signal, a 5V output signal, a 3.3V output signal, and a power good signal.

3. The method according to claim 2 wherein said electronic device is in said normal state when each of said output signals has a voltage level greater than a predetermined minimal value and said electronic device is in said abnormal state when one of said output signals has a voltage level lower than a predetermined minimal value.

4. The method according to claim 3 wherein said predetermined minimal value is 8.5V when the voltage level of said output signal is 12V.

5. The method according to claim 3 wherein said predetermined minimal value is 3.3V when the voltage level of said output signal is 5V.

6. The method according to claim 3 wherein said predetermined minimal value is 2.2V when the voltage level of said output signal is 3V.

7. The method according to claim 3 wherein said predetermined minimal value of said power good signal is 3V.

8. The method according to claim 1 wherein said first signal is a greenlight signal, said second signal is a red-light signal, and said third signal is an orange light signal by combining said green light signal and said red light signal.

9. The method according to claim 1 wherein said step (c) further includes a step of maintaining said second signal when said electronic device is in said abnormal state.

10. A method for testing an electronic device in a burn-in process, wherein said electronic device has an output signal, comprising steps of:
    (a) providing a test circuit electrically connected to said electronic device;
    (b) detecting one of a normal and a abnormal state of said electronic device by checking said output signal;
    (c) generating a first signal when said electronic device is in said normal state and generating a second signal when said electronic device is in said abnormal state;
    (d) rechecking said output signal; and
    (e) generating a third signal when said electronic device is in said abnormal state at previously testing period and in said normal state at subsequently testing period.

11. The method according to claim 10 wherein said electronic device is in said normal state when said output signal has a voltage level greater than a predetermined minimal value and said electronic device is in said abnormal state when said output signal has a voltage level lower than a predetermined minimal value.

12. The method according to claim 11 wherein said first signal is a green light signal, said second signal is a red light signal, and said third signal is an orange light signal by combining said green light signal and said red light signal.

13. An apparatus for testing an electronic device in a burn-in process, wherein said electronic device has a plurality of output signals, comprising:
    a first test circuit electrically connected to said electronic device for detecting one of a normal and a abnormal state of said electronic device by checking said output signals and generating a first signal when said electronic device is in said normal state; and
    a second test circuit electrically connected to said first test circuit for checking said output signals and generating a second signal when said electronic device is in said abnormal state;
    wherein said apparatus generates a third signal to indicate that said electronic device is in said abnormal state at a previously testing period and in a normal state at a subsequently testing period after said electronic device is re-tested by said first and second test circuit.

14. The apparatus according to claim 13 wherein said first test circuit includes:
    a plurality of photo-coupled transistors;
    a first light-emitting diode (LED) for generating said first signal in response to said normal state of said electronic device; and
    a buffer gate electrically connected between said first LED and said photo-coupled transistors for allowing said first LED to generate said first signal.

15. The apparatus according to claim 14 wherein said buffer gate includes a plurality of AND gates connected in parallel.

16. The apparatus according to claim 14 wherein said second test circuit includes:
    a second LED for generating said second signal in response to said abnormal state of said electronic device; and a switch mounted between said first test circuit and said second LED for allowing said second LED to generate said second signal.

17. The apparatus according to claim 16 wherein said switch includes tow AND gates and two silicon-controlled rectifiers (SCR).

18. The method according to claim 13 wherein said first signal is a green-light signal, said second signal is a red-light signal, and said third signal is an orange light signal by combining said green light signal and said red light signal.

19. The method according to claim 13 wherein said electronic device is in said normal state when each of said output signals has a voltage level greater than a predetermined minimal value and said electronic device is in said abnormal state when one of said output signals has a voltage level lower than a predetermined minimal value.

20. The method according to claim 19 wherein said predetermined minimal value is 8.5V when the voltage level of said output signal is 12V.

21. The method according to claim 19 wherein said predetermined minimal value is 3.3V when the voltage level of said output signal is 5V.

22. The method according to claim 19 wherein said predetermined minimal value is 2.2V when the voltage level of said output signal is 3V.

23. The method according to claim 19 wherein said predetermined minimal value of said power good signal is 3V.

* * * * *